United States Patent [19]

Suzuki et al.

[11] Patent Number: 4,809,227

[45] Date of Patent: Feb. 28, 1989

[54] READ ONLY MEMORY DEVICE HAVING MEMORY CELLS EACH STORING ONE OF THREE STATES

[75] Inventors: Yasuo Suzuki, Yokohama; Yasuaki Suzuki; Nobuo Ikuta, both of Kawasaki, all of Japan

[73] Assignee: Fujitsu Limited, Kanagawa, Japan

[21] Appl. No.: 82,479

[22] Filed: Aug. 5, 1987

[30] Foreign Application Priority Data

Aug. 6, 1986 [JP] Japan ................................ 61-183329

[51] Int. Cl.$^4$ ............................................. G11C 11/40
[52] U.S. Cl. .................................... 365/168; 365/187; 365/189
[58] Field of Search ................ 365/187, 189, 230, 168

[56] References Cited

U.S. PATENT DOCUMENTS 4,327,424  4/1982  Wu ...................................... 365/168
4,653,023  3/1987  Suzuki et al. ........................ 365/168

Primary Examiner—Terrell W. Fears
Attorney, Agent, or Firm—Armstrong, Nikaido Marmelstein & Kubovcik

[57] ABSTRACT

A read only memory device including: a memory cell array having a plurality of memory cells each storing one of three states; selection means, connected to the memory cell array, for selecting a pair of the memory cells from the memory cell array simultaneously in accordance with an address signal; a first sense amplifier, operatively connected to one of the pair of the memory cells, for producing a three bit output corresponding to the state stored in the one of the pair of the memory cells selected by the selection means; and a second sense amplifier, operatively connected another of the pair of memory cells, for producing a three bit output corresponding to the state stored in the another of the pair of the memory cells selected by the selection means.

The device further includes decoder means, connected to the first and second sense amplifiers, for receiving the three bit outputs of the first and second amplifiers and producing a binary three bit output corresponding to the states stored in the pair of memory cells.

5 Claims, 6 Drawing Sheets

READ ONLY MEMORY DEVICE HAVING MEMORY CELLS EACH STORING ONE OF THREE STATES

BACKGROUND OF THE INVENTION

1. Field of the Invention

The present invention relates to a multi-value level read only memory (ROM), and more particularly, to decoding of information read out from a pair of memory cells simultaneously.

2. Description of the Related Art

The development of multi-value level memory cells is drawing great attention as a way in which to enhance the integration degree of read only memories (ROM's), and there are disclosures in the prior art using four value level cells, from among multi-value levels (For example, U.S. Pat. Nos. 4,503,518, 4,449,203, and I.E.E.E., J. of Solid State Circuits, Vol. SC-16, No. 5 Oct. pp. 522–529). Nevertheless, the relationship between the yield of the devices and a number of multi-values is antagonistic, and it is not always possible to ensure that the enhancement of the number of multi-values corresponds to an improved mass-production. With regard to the memory cell producing one of three value levels, as an example of the memory cell producing one of multi-value levels, a problem arises in that satisfactory results have not been obtained as yet, because the read out data from one memory cell cannot be processed as binary data.

SUMMARY OF THE INVENTION

It is an object of the present invention to provide an improved ROM using memory cells each producing one of three value levels, the function of the memory cells being such that information in the form of three bits is obtained from each two memory cells. Therefore, in accordance with the present invention, there is provided a read only memory device including: a memory cell array having a plurality of memory cells each storing one of three states; a selection device, connected to the memory cell array, for selecting a pair of the memory cells from the memory cell array simultaneously in accordance with an address signal; a first sense amplifier, operatively connected to one of the pair of the memory cells, for producing a three bit output corresponding to the state stored in the one of the pair of the memory cells selected by the selection device; a second sense amplifier, operatively connected another of the pair of memory cells, for producing a three bit output corresponding to the state stored in the another of the pair of the memory cells selected by the selection device; and decoder device, connected to the first and second sense amplifiers, for receiving the three bit outputs of the first and second amplifiers and producing a binary three bit output corresponding to the states stored in the pair of memory cells.

DESCRIPTION OF THE PREFERRED EMBODIMENTS

Before describing the preferred embodiments of the invention, the structure of a memory cell transistor having an effective gate width W will be described with reference to FIG. 1A.

In the plane view below, a bit line intersects with word lines, and diffusion layer is formed around the bit line and a cell transistor is arranged at the intersection of a bit line and a word line, which cell transistor has a drain, a gate and a source. The gate electrode is formed as the overlapping of the diffusion layer and the word line.

Figure 1A:
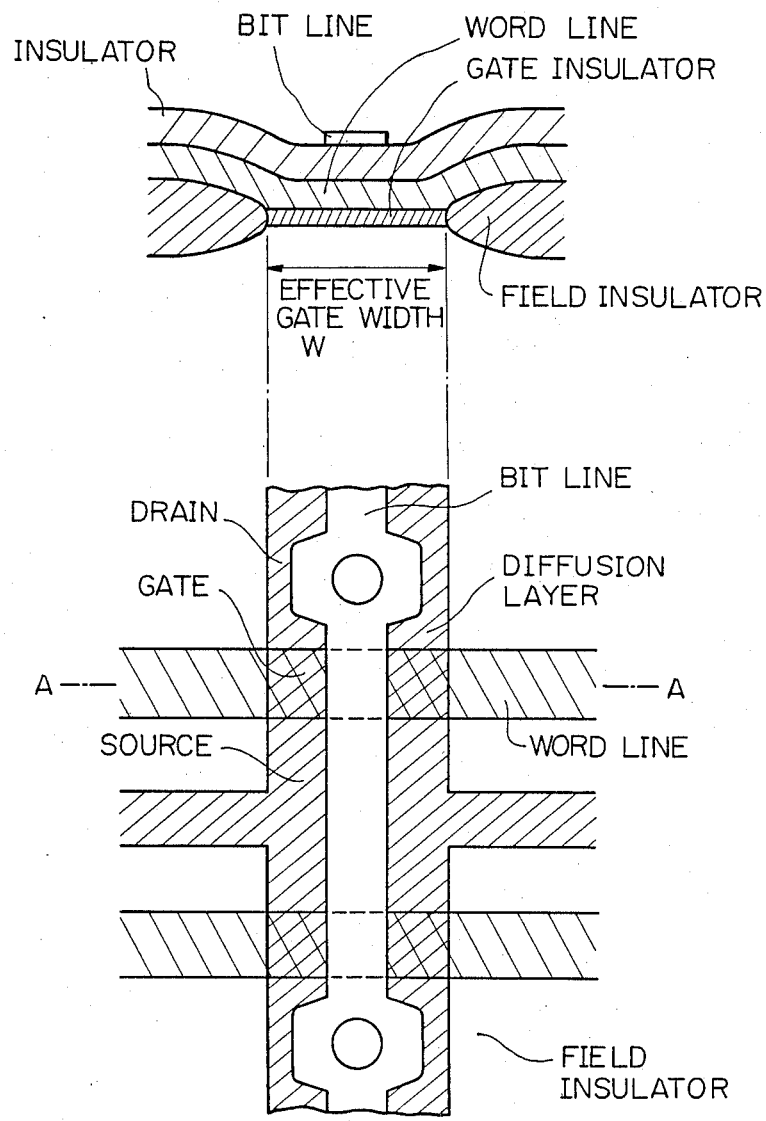
FIG. 1A is a schematic diagram showing the structure of a memory cell transistor.

In the cross-sectional view at the top of the FIG. 1A, the effective width W of the gate is shown.

The selection of the gate width of a transistor will be described with reference to FIG. 1B.

A three value level ROM is composed of a cell transistor Q.

In FIG. 1A, the mutual conductance or gm of a cell transistor Q is selected from the values $gm_1$, $gm_2$, and $gm_3$, the value of a mutual conductance gm of a reference cell transistor is equivalent to $gm_2$.

Each of the sense amplifiers SA1 and SA2 has a first comparator circuit that compares a voltage from a reference cell transistor having the mutual conductance gm of an intermediate level REF1 between states I and II with the potentials of the bit lines, and a second comparator circuit that compares a voltage from a reference cell transistor having the mutual conductance gm of intermediate level REF2 between the states II and III with the potentials of the bit lines, thus enabling distinguising the levels of the states I, II, and III.

Figure 1B:
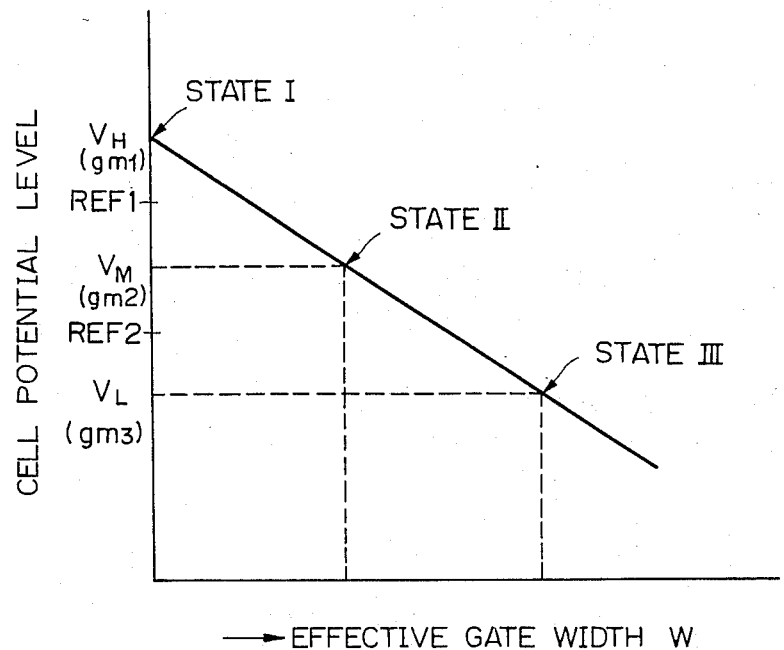
FIG. 1B shows the characteristics of a memory cell transistor of a ROM in accordance with the present invention.

A cell transistor Q is connected to a signal generator, from which the voltages of $V_H$, $V_M$, and $V_L$ in FIG. 1B are output in response to the voltage of $gm_1$, $gm_2$, and $gm_3$. For detecting the states I, II, and III, two transistors are used: that is, a reference cell transistor which generates an intermediate voltage REF1 between the voltages $V_H$ and $V_M$ and another reference cell transistor which generates an intermediate voltage REF2 between the voltages $V_M$ and $V_L$. For example, when the voltage output from the memory cell transistor is smaller than REF1 and larger than REF2, the state II is stored.

With respect to the three value level cell, the information of one cell is equivalent to 1.5 bit/cell, as there are three states, and thus a reading of only one cell is not practical. Therefore, in the present invention two cells are selected simultaneously for reading out one of nine states stored by 2 cells. Namely, in the present invention, binary 3 bit information is stored in 2 cells.

Figure 2:
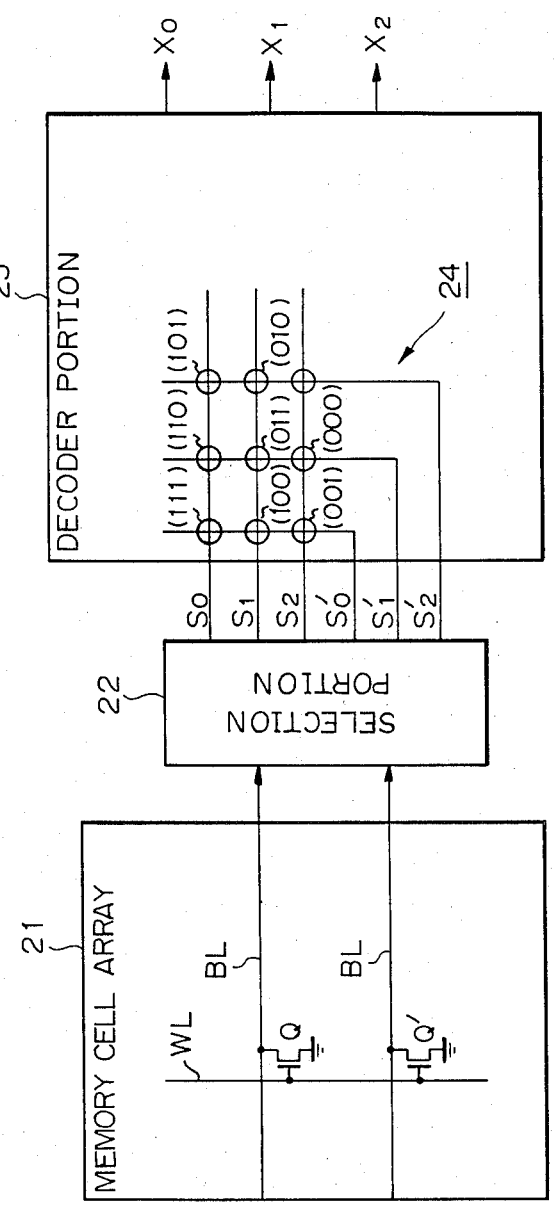
FIG. 2 shows a basic structure of the ROM according to the present invention.

The basic structure of a ROM (read only memory) according to the present invention is shown in FIG. 2. In the structure shown in FIG. 2, a memory cell array 21 has a pair of cell transistors Q, Q' which are arranged in the vicinity of the points at which the word line WL and bit line BL and BL' cross. The value of the mutual conductance gm of the cell transistors Q and Q' can be selected from the three values $gm_1$, $gm_2$, and $gm_3$. The selection portion 22 connected to the above-noted memory cell array 21 selects two cell transistors Q and Q' simultaneously from the cell array 21, thus producing 3×3 states. In this case, since the gm value of the cell transistor Q has one of three values, data $S_0$, $S_1$, and $S_2$ are produced by the other cell transistor Q', and thus the 3×3 states are created. $S_0$, $S_1$, and $S_2$ respond to the state which the cell transistor Q stores. In response to the aforementioned states I to III, one bit among the three bits data $S_0$, $S_1$, and $S_2$ is "1". As for $S_0'$, $S_1'$, and $S_2'$, the same is valid.

For example, if $(S_0, S_1, S_2) = (1, 0, 0)$ and $(S_0', S_1', S_2') = (0, 1, 0)$, then, three-bit binary data $(X_0, X_1, X_2) = (1, 1, 0)$ is output from the decoder portion 23, which is regarded as a kind of ROM. Binary three bit codes (111), (110), (101), (100), (011), (010), (001), and (000) correspond respectively to eight states among the 3×3=9 states. In this case, another state exists, but is regarded as vacant.

Figure 3:
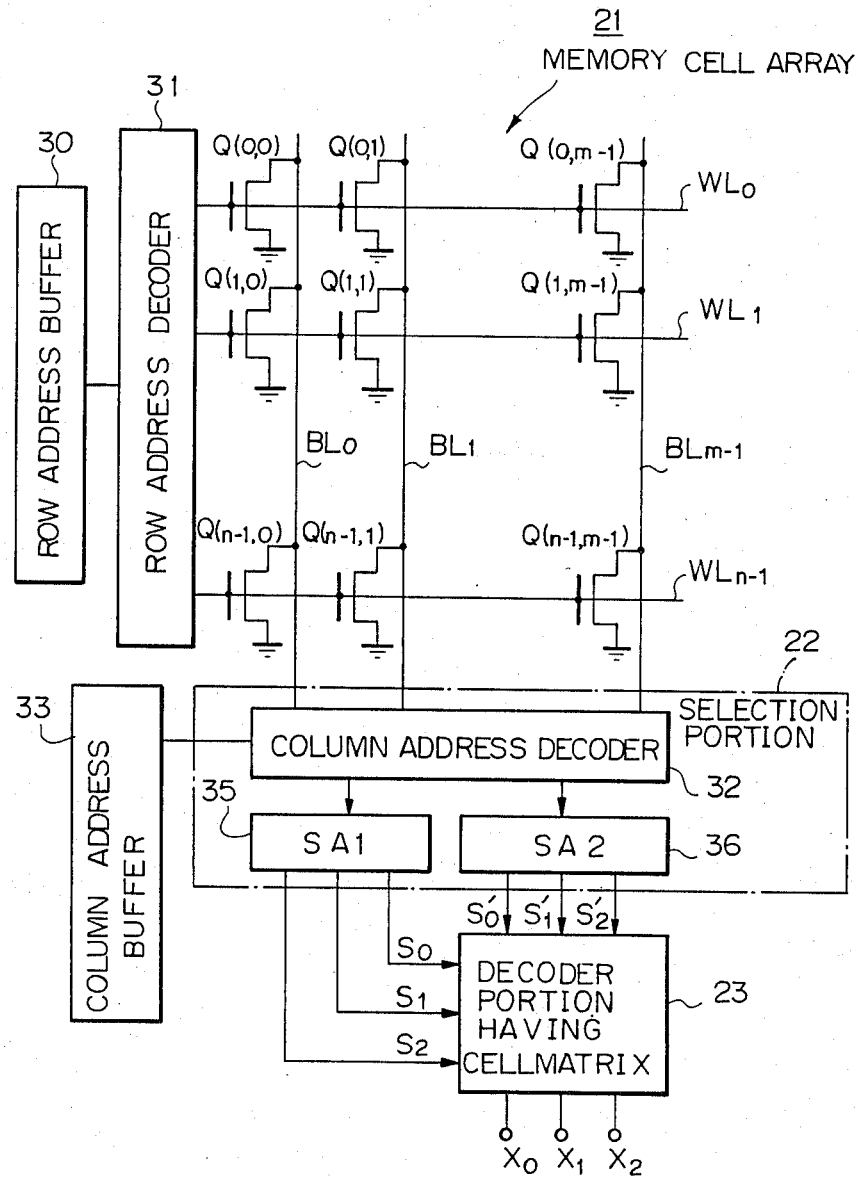
FIG. 3 is a schematic circuit diagram of the ROM according to an embodiment of the present invention.

A three value level ROM in accordance with an embodiment of the present invention is shown in FIG. 3. In the ROM shown in FIG. 3, there are provided a row address decoder 31 which selects any one of word lines $WL_0$, $WL_1$, ..., $WL_{n-1}$ in response to a row address signal from a row address buffer 30. In the Figure, 32 is a column address decoder which selects any two of bit lines $BL_0$, $BL_1$, ..., $BL_{m-1}$ in response to a column address signal from a column address buffer 33. Cell transistors $Q_{(0,0)}$, $Q_{(0,1)}$, ..., $Q_{(n-1,m-1)}$, which are N-channel enhancement type transistors, are arranged at the points at which each word line $WL_0$, $WL_1$, ..., $WL_{n-1}$ intersects each bit line $BL_0$, $BL_1$, ..., $BL_{m-1}$.

In the ROM shown in FIG. 3, these cell transistors are endowed with three kinds of mutual conductance gm. This adjustment of the mutual conductance gm, that is, reading of the ROM, is carried out by varying the effective width W of the gate. This adjustment of the mutual conductance gm may be carried out by varying a doping amount of impurities such as boron directly below the gate of cell transistor.

If one of the word lines $WL_0 \sim WL_{n-1}$, for example, $WL_0$, is selected by a row address decoder 31, and two bit lines, for example, $BL_0$ and $BL_1$, are selected by a column address decoder 32, cell transistors Q (0, 0) and Q (0, 1) are turned ON, and thus current flows through each cell load transistor built in a respective sense amplifier SA1, SA2 to cell transistors Q (0, 0) and Q (0, 1), respectively. As a result, each of the potentials at the bit lines $BL_0$, $BL_1$ is a value corresponding to the mutual conductance gm of the cell transistors Q (0, 0) and Q (0, 1). Each of the sense amplifiers SA1 and SA2 has a first comparator circuit that compares a voltage from a reference cell transistor having the mutual conductance gm of an intermediate level REF1 between states I and II in FIG. 1B with the potentials of the bit lines, and a second comparator circuit that compares a voltage from a reference cell transistor having the mutual conductance gm of intermediate level REF2 between the states II and III in FIG. 1 (B) with the potentials of the bit lines. As an example of the sense amplifier, the one disclosed in the Japanese Patent Application No. 61-185246 may be utilized. Based upon the result of these comparation, the outputs $S_0$, $S_1$ and $S_2$ (or $S_0'$, $S_1'$ and $S_2'$) are delivered. For example, if state I exists, then $(S_0, S_1, S_2) = (1, 0, 0)$;

if state II exists, then $(S_0, S_1, S_2) = (0, 1, 0)$;

and if state III exists, then $(S_0, S_1, S_2) = (0, 0, 1)$.

Figure 4:
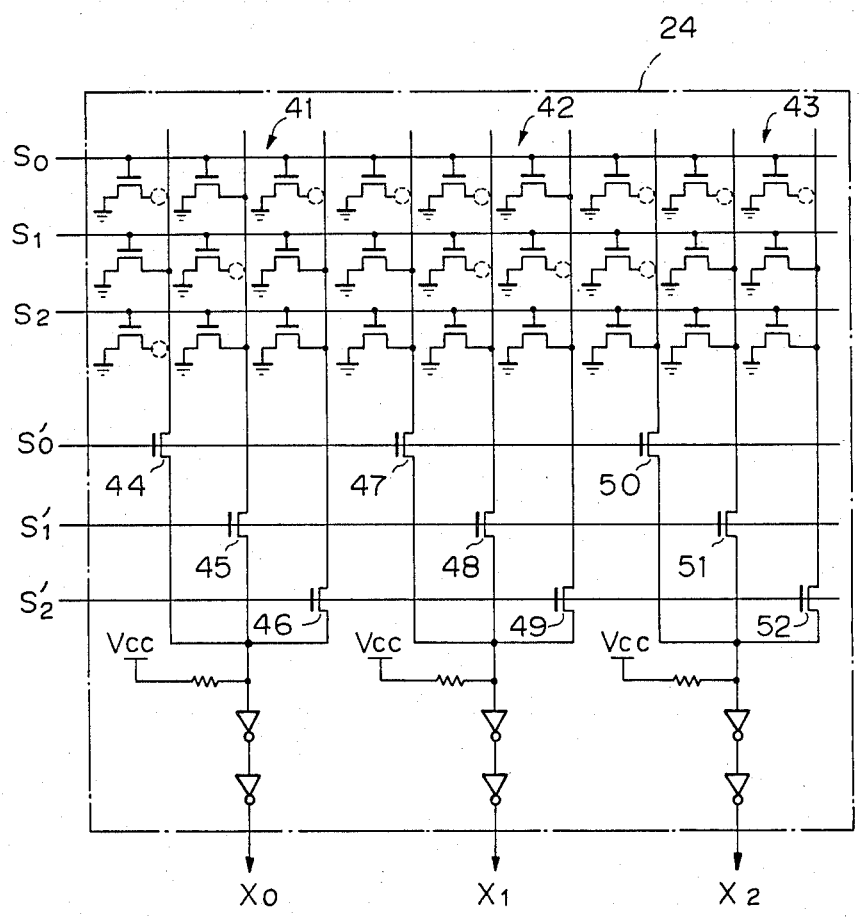
FIG. 4 is a circuit diagram of the cell matrix used in the ROM shown in FIG. 3; and, FIG. 5 is a schematic circuit diagram of the column address decoder used in the ROM shown in FIG. 3.

The structure of a cell matrix 24 used in the ROM shown in FIG. 3 is shown in FIG. 4.

The cell matrix 24 is accessed by making ($S_0$, $S_1$, $S_2$) a row address, and ($S_0'$, $S_1'$, $S_2'$) a column address, to output the three bits of information ($0_0$, $0_1$, $0_2$).

The cell matrix 24 has three 3×3 matrix 41, 42, 43. In this case, each of the 3×3 matrix 41, 42, 43 is used for producing the outputs $X_0$, $X_1$, and $X_2$. The stored content of each cell of a respective matrix 41, 42, and 43 is represented by a two value level. As shown in FIG. 4, for example, if $(S_0, S_1, S_2) = (1, 0, 0)$ and $(S_0', S_1', S_2') = (1, 0, 0)$, then the first rows of each matrix 41, 42, 43 are selected and the switching elements 44, 47, 50 are turned ON. As a result, in response to the connection of transistors, the outputs $X_0$, $X_1$ and $X_2$ are HIGH level (equal to "1"), HIGH level (equal to "1"), and HIGH level (equal to "1"), respectively. Therefore, in response to the state of ($S_0$, $S_1$, $S_2$) and ($S_0'$, $S_1'$, $S_2'$), the binary three-bits-information ($X_0$, $X_1$, $X_2$) can be obtained.

Figure 5:
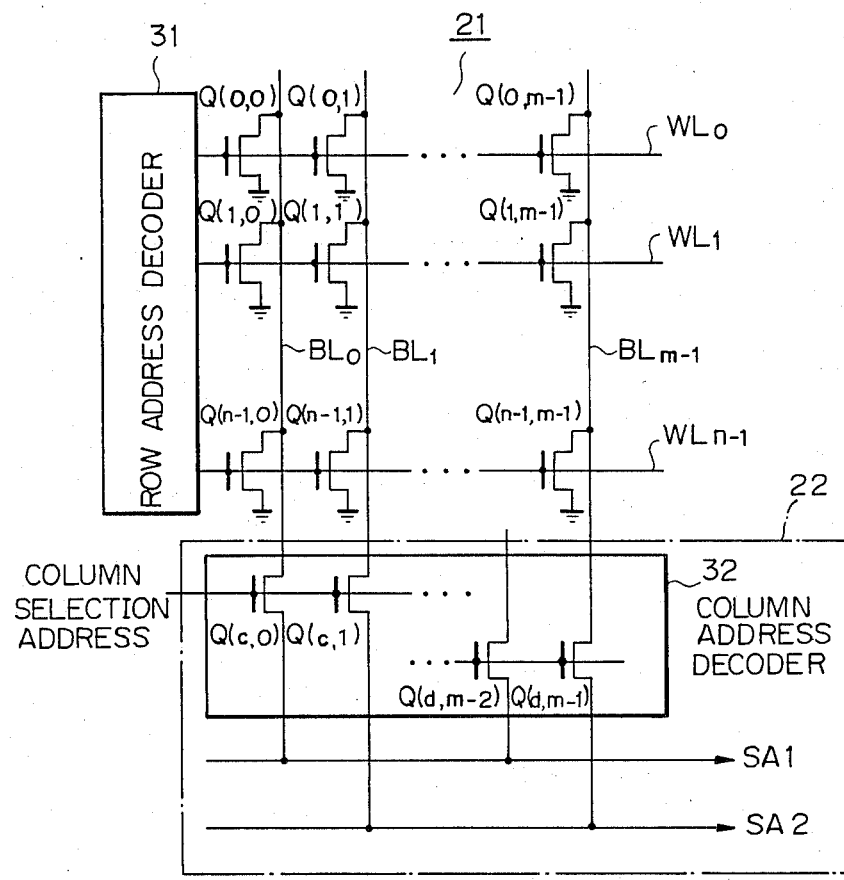

The circuit diagram of a column address decoder used in the ROM shown in FIG. 3 is shown in FIG. 5, wherein 21 is a memory cell array, 31 a row address decoder, and 22 a selection portion. A selection portion 22 contains a column address decoder 32 and the output thereof is delivered to sense amplifiers SA1 and SA2. The column address decoder 32 contains two sets of transistors viz., (Q (c, 0), Q (c, 1), ...) and ... Q (d, m−2), Q (d, m−1). A column selection address is applied to two sets of transistors, respectively.

We claim:

1. A read only memory device comprising:
a memory cell array having a plurality of memory cells each storing one of three states;
a selection means, connected to said memory cell array, for selecting two memory cells simultaneously from said memory cell array in accordance with an address signal;
a first sense amplifier, connected to one of the two selected memory cells, for producing a three bit output corresponding to the state stored in the one of the two selected memory cells selected by said selection means;
a second sense amplifier, connected to another of the two selected memory cells, for producing a three bit output corresponding to the state stored in said another of the two selected memory cells selected by said selection means; and
a decoder means, connected to said first and second sense amplifiers, for receiving the three bit outputs of said first and second amplifiers and for producing a three bit binary data output corresponding to the states stored in the
two selected memory cells, said decoder means comprising a read only memory receiving said three bit output from said first sense amplifier as a column address and said three bit output from said second sense amplifier as a row address.

2. A read only memory device according to claim 1, wherein the read only memory comprises a matrix of transistors.

3. A read only memory device according to claim 1, wherein said memory cells are comprised of transistors each having a mutual conductance corresponding to one of the three states.

4. A device according to claim 3, wherein the adjustment of mutual conductance gm can be carried out by variation of a dopant of impurities in each cell transistor.

5. A device according to claim 3, wherein the adjustment of mutual conductance gm can be carried out by variation of the effective gate width.

* * * * *